(12) United States Patent
Sato et al.

(10) Patent No.: US 10,312,662 B2
(45) Date of Patent: Jun. 4, 2019

(54) OPTICAL MODULE AND OPTICAL TRANSMISSION EQUIPMENT

(71) Applicant: Oclaro Japan, Inc., Kanagawa (JP)

(72) Inventors: Takuya Sato, Kanagawa (JP); Keiichi Murakami, Kanagawa (JP); Koki Sato, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 16/003,367

(22) Filed: Jun. 8, 2018

(65) Prior Publication Data

US 2018/0375286 A1 Dec. 27, 2018

(30) Foreign Application Priority Data

Jun. 23, 2017 (JP) .................................. 2017-122966

(51) Int. Cl.
*H01S 3/00* (2006.01)
*H01S 5/024* (2006.01)
*H01S 5/022* (2006.01)

(52) U.S. Cl.
CPC .......... *H01S 5/02476* (2013.01); *H01S 5/024* (2013.01); *H01S 5/02236* (2013.01); *H01S 5/02446* (2013.01); *H01S 5/02453* (2013.01); *H01S 5/02469* (2013.01); *H01S 5/0222* (2013.01); *H01S 5/02212* (2013.01); *H01S 5/02407* (2013.01); *H01S 5/02415* (2013.01)

(58) Field of Classification Search
CPC ............ H01S 5/02476; H01S 5/02415; H01S 5/02236; H01S 5/02469; H01S 5/02453; H01S 5/02446; H01S 5/024; H01S 5/02407; H01S 5/0222; H01S 5/02212

See application file for complete search history.

(56) References Cited

U.S. PATENT DOCUMENTS

| 5,740,191 | A | * | 4/1998 | Kasper | ................ | H01S 5/02216 372/34 |
| 7,670,063 | B2 | * | 3/2010 | Ice | ........................ | G02B 6/4246 385/76 |
| 2003/0141090 | A1 | * | 7/2003 | Kruger | ................. | G02B 6/4201 174/50 |
| 2007/0278666 | A1 | * | 12/2007 | Garcia | ................. | G02B 6/4202 257/707 |
| 2009/0219963 | A1 | * | 9/2009 | Mogi | ................... | G02B 6/4246 372/36 |
| 2016/0246019 | A1 | * | 8/2016 | Ishii | ...................... | G02B 6/4272 |

FOREIGN PATENT DOCUMENTS

JP 2016-156916 A 9/2016

* cited by examiner

*Primary Examiner* — Kinam Park (74) *Attorney, Agent, or Firm* — Mattingly & Malur, PC (57) ABSTRACT

To provide an optical module whose power consumption in an ambient temperature range is reduced, and an optical transmission equipment. The optical module includes: a housing; a box type optical subassembly including a bottom portion serving as a heat dissipation face; and a heat conductive member disposed between the bottom portion of the optical subassembly and a bottom portion of the housing. The optical subassembly includes one or a plurality of optical semiconductor devices, and a temperature controller on which the one or plurality of optical semiconductor devices are mounted and which is placed on an inner bottom portion of the optical subassembly. The heat conductive member is disposed only at a portion of the bottom portion of the optical subassembly.

5 Claims, 9 Drawing Sheets

OPTICAL MODULE AND OPTICAL TRANSMISSION EQUIPMENT

CROSS-REFERENCE TO RELATED APPLICATION

The present application claims priority from Japanese application JP2017-122966 filed on Jun. 23, 2017, the content of which is hereby incorporated by reference into this application.

BACKGROUND OF THE INVENTION

1. Field of the Invention

The present invention relates to an optical module and an optical transmission equipment, and particularly to a technique for dissipating heat generated in an optical subassembly included in an optical module.

2. Description of the Related Art

In general, one or a plurality of optical subassemblies are mounted in an optical module. One or a plurality of optical semiconductor devices are mounted in each of the one or plurality of optical subassemblies. It is required of such an optical module to operate within a desired ambient temperature range. Therefore, a temperature controller such as a Peltier device is disposed between a housing and the optical semiconductor device in the optical subassembly, and by heating or cooling with such a temperature controller, the temperature in the inner structure (especially the optical semiconductor device) of the optical subassembly is maintained at (around) an operating temperature during operation.

SUMMARY OF THE INVENTION

Power is consumed for performing temperature regulation by the temperature controller. Therefore, it is desirable to reduce the power consumption of the temperature controller for reducing the power consumption of the optical module. It is conventionally considered that the power consumption of the temperature controller is highest at the upper limit of the desired ambient temperature range. The optical semiconductor device itself generates heat during operation, and therefore, the temperature controller cools the optical semiconductor device to the operating temperature on the high temperature side of the desired ambient temperature range. It is desirable to further release the heat generated in the optical semiconductor device to an external environment because the optical semiconductor device generates heat. For enhancing heat dissipation from the optical subassembly to the housing of the optical module on the high temperature side, it is desirable to further enhance heat conduction between the bottom portion of the optical subassembly and the bottom portion of the housing of the optical module.

In recent years, it has been desired for the optical module to operate in a wider ambient temperature range. That is, the lower limit of the desired ambient temperature range also becomes lower. The temperature controller heats the optical semiconductor device to the operating temperature on the low temperature side of the desired ambient temperature range. However, the optical semiconductor device generates heat, and therefore, in contrast to the high temperature side, it is undesirable to further release the heat generated in the optical semiconductor device to an external environment.

Since the desired ambient temperature range is widened, especially since the lower limit becomes lower, it becomes necessary, for reducing the power consumption of the optical module in the desired ambient temperature range, to consider the low temperature side at which the temperature controller heats the optical semiconductor device in addition to the high temperature side at which the temperature controller cools the optical semiconductor device. Such a problem is a finding obtained as a result of intensive studies by the present inventors, and the present invention has been accomplished based on such a finding by the present inventors.

As a related art, JP 2016-156916 A discloses the optical transceiver 1 including the assembly board 9 on which the optical semiconductor device such as an LD and the electrical device such as a driver are mounted. The heat sink 60 abuts on the upper housing 4 of the optical transceiver 1. The heat dissipation face of the assembly board 9 is in thermal contact with the upper housing 4 through the heat dissipation gel 14. It is described in JP 2016-156916 A that "a thermal path from a heat source such as the optical semiconductor device mounted on the assembly board 9 to the heat sink 60 is short and thus heat generated in the heat source can be efficiently released" (see paragraph 0025 in JP 2016-156916 A). Further, it is also described that "it is desirable, for improving heat dissipation efficiency, that the area of the board main body 9a of the assembly board 9 is wide (paragraph 0026 in JP 2016-156916 A).", and also in JP 2016-156916 A, attention is paid only to the high temperature side of the desired ambient temperature range.

The present invention has been made in view of such a problem, and it is an object of the present invention to provide an optical module whose power consumption in an ambient temperature range is reduced, and an optical transmission equipment.

(1) For solving the above problem, an optical module according to an aspect of the present invention includes: a housing; a box type optical subassembly including a bottom portion serving as a heat dissipation face; and a heat conductive member disposed between the bottom portion of the optical subassembly and a bottom portion of the housing, wherein the optical subassembly includes one or a plurality of optical semiconductor devices, and a temperature controller on which the one or plurality of optical semiconductor devices are mounted and which is placed on an inner bottom portion of the optical subassembly, and the heat conductive member is disposed only at a portion of the bottom portion of the optical subassembly.

(2) The optical module according to (1), wherein an area where the heat conductive member is disposed with respect to the entire bottom portion of the optical subassembly may be 15% or more and 55% or less.

(3) The optical module according to (1) or (2), wherein the heat conductive member may be disposed such that power consumption of the optical module at a lower limit of an ambient temperature range with respect to power consumption of the optical module at an upper limit falls within a range of ±10%.

(4) The optical module according to any of (1) to (3), wherein the heat conductive member may be any one selected from the group of a heat dissipation grease, a gel for heat dissipation, and a sheet for heat dissipation.

(5) An optical transmission equipment according to an aspect of the present invention may include the optical module according to any of (1) to (4) mounted therein.

The present invention provides an optical module whose power consumption in an ambient temperature range is reduced, and an optical transmission equipment.

DETAILED DESCRIPTION OF THE INVENTION

Hereinafter, embodiments of the present invention will be described specifically and in detail with reference to the drawings. In all the drawings for describing the embodiments, the same reference numerals are given to the members having the same function, and the repeated description thereof will be omitted. The drawings illustrated below merely illustrate examples of the embodiments, and the sizes of the drawings and the scales described in the embodiments do not necessarily coincide with each other.

Figure 1:
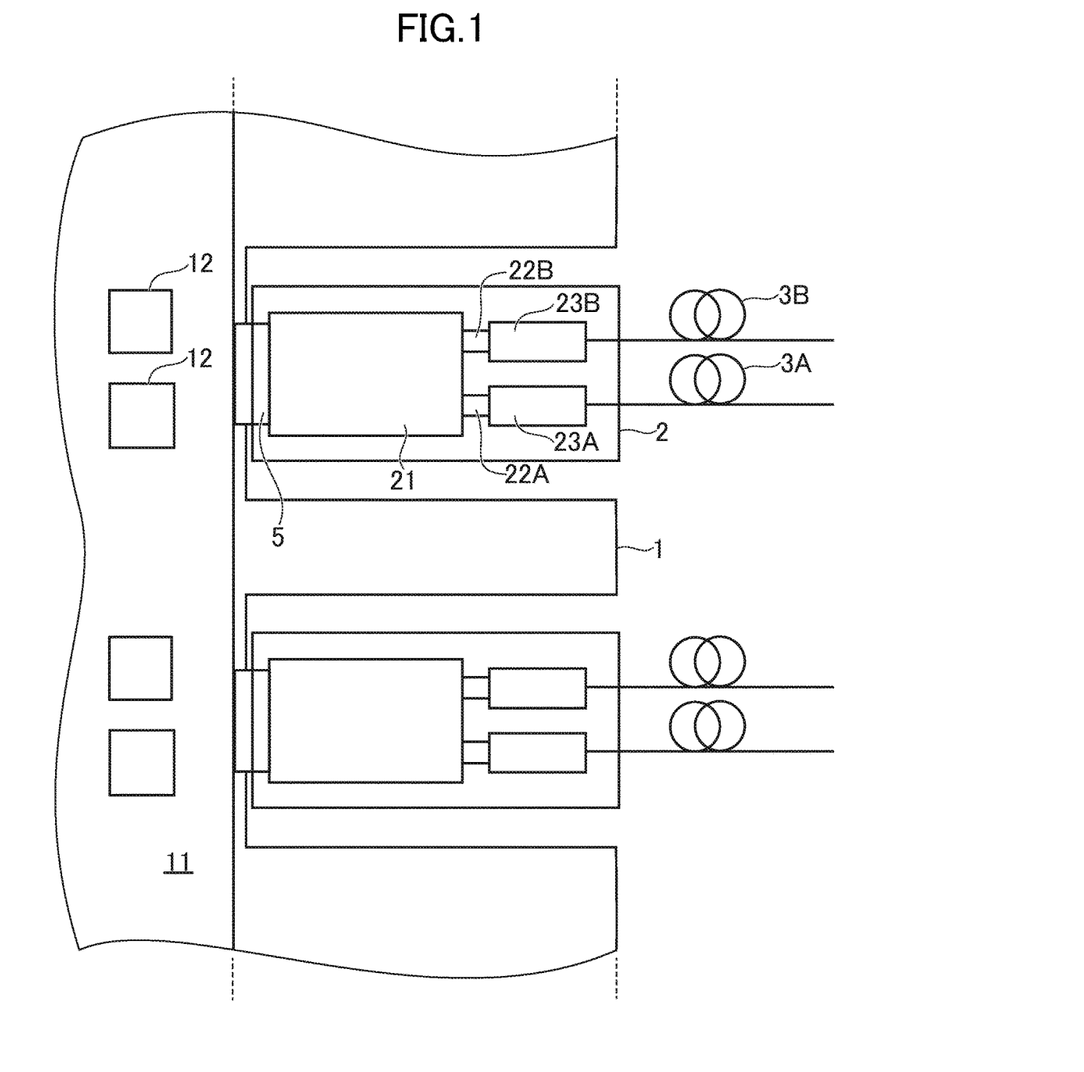
FIG. 1 is a schematic view illustrating a configuration of an optical transmission equipment and an optical module according to an embodiment of the present invention.

FIG. 1 is a schematic view illustrating a configuration of an optical transmission equipment land an optical module 2 according to an embodiment of the present invention. The optical transmission equipment 1 includes a control board 11 (printed circuit board: PCB) and an IC 12. The optical transmission equipment 1 is, for example, a large-capacity router or a switch. The optical transmission equipment 1 has, for example, a function of a switching equipment, and is disposed in a base station or the like. A plurality of optical modules 2 are mounted in the optical transmission equipment 1. The optical transmission equipment 1 acquires data for receiving (electric signal for receiving) from the optical module 2, determines to transmit what data to where using the IC 12 or the like, generates data for transmitting (electric signal for transmitting), and transmits the data to the corresponding optical module 2 through the control board 11.

The optical module 2 is a transceiver having a function of optical transmitting and a function of optical receiving. The optical module 2 includes a control board 21 (printed circuit board), an optical transmitter module 23A which converts an electric signal to an optical signal and transmits the optical signal to an optical fiber 3A, and an optical receiver module 23B which converts an optical signal received through an optical fiber 3B into an electric signal. The control board 21 is connected to the optical transmitter module 23A and the optical receiver module 23B through flexible printed circuits 22A and 22B (FPC), respectively. An electric signal is transmitted from the optical receiver module 23B to the control board 21 through the flexible printed circuits 22A, and an electric signal is transmitted from the control board 21 to the optical transmitter module 23A through the flexible printed circuits 22B. Each of the optical modules 2 and the optical transmission equipment 1 are connected to each other through an electrical connector 5. The optical transmitter module 23A and the optical receiver module 23B are electrically connected to the control board 21 and convert an electric/optical signal into an optical/electric signal.

A transmission system according to this embodiment includes two or more of the optical transmission equipments 1, two or more of the optical modules 2, and one or more of optical fibers 3. One or more of the optical modules 2 are connected to each of the optical transmission equipments 1. The optical fiber 3 is connected between the optical modules 2 mounted on the two optical transmission equipments 1, respectively. Transmitting data generated by one of the two optical transmission equipments 1 is converted into an optical signal by the mounted optical module 2, and such an optical signal is transmitted to the optical fiber 3. The optical signal transmitted over the optical fiber 3 is received by the optical module 2 mounted on the other of the two optical transmission equipments 1, and the optical module 2 converts the optical signal into an electric signal and transmits the electric signal to the other of the optical transmission equipment 1 as receiving data.

Figure 2:
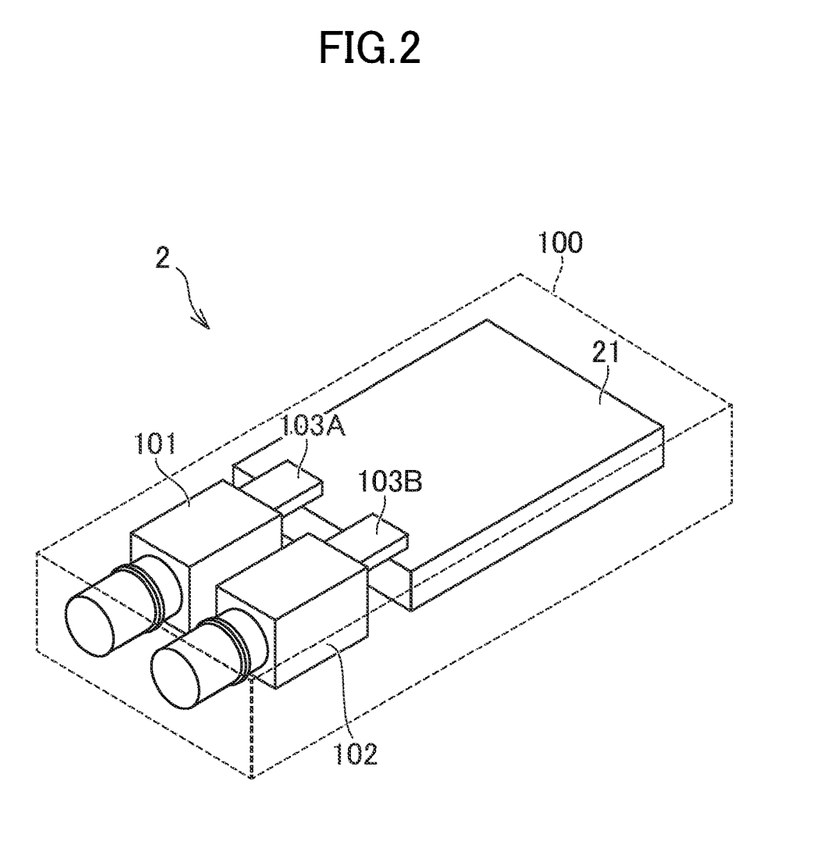
FIG. 2 is a perspective view illustrating a structure of the optical module according to the embodiment of the present invention.

FIG. 2 is a perspective view illustrating a structure of the optical module 2 according to this embodiment. The optical module 2 according to this embodiment can operate in a wide ambient temperature range. Herein, the ambient temperature range is a temperature range of $-5°$ C. to $85°$ C. In the specification, the term "ambient temperature range" means the temperature of a surrounding external environment in which the optical module 2 is disposed when the optical module 2 operates. The optical module 2 includes a module case 100 (housing), a TOSA 101 (Transmitter Optical Sub-Assembly), a ROSA 102 (Receiver Optical Sub-Assembly), the control board 21, and flexible printed circuits 103A and 103B respectively connecting the TOSA 101 and the ROSA 102 with the control board 21. In FIG. 2, the module case 100 is illustrated by a broken line for describing a configuration of main components of the optical module 2. In the control board 21 of the optical module 2 according to this embodiment, a connection portion to the optical transmission equipment 1 is a card edge portion. The optical module 2 is a pluggable module that is used by being directly inserted into or removed from the optical transmission equipment 1. The optical module 2 according to this embodiment conforms to the SFP+(Enhanced Small Form Factor Pluggable) standard, and the transmission rate of the optical module 2 is 10 Gbit/s.

The optical transmitter module 23A includes one or a plurality of optical subassemblies. However, the optical transmitter module 23A according to this embodiment is composed of one optical subassembly, and this optical subassembly is the TOSA 101. The TOSA 101 is a box type optical subassembly including a bottom portion serving as a heat dissipation face. When the optical transmitter module 23A includes a plurality of optical subassemblies, the flexible printed circuit 22A includes a plurality of sub-flexible printed circuits for connecting the plurality of optical subassemblies with the control board 21. Here, the optical transmitter module 23A is composed of one optical subassembly, and the flexible printed circuit 22A is composed of one flexible printed circuit 103A. Similarly, the optical receiver module 23B includes one or a plurality of optical subassemblies, however, the optical receiver module 23B according to this embodiment is composed of one optical subassembly, and this optical subassembly is the ROSA 102. Similarly to the TOSA 101, the ROSA 102 is a box type optical subassembly. When the optical receiver module 23B includes a plurality of optical subassemblies, the flexible printed circuit 22B includes a plurality of sub-flexible printed circuits for connecting the plurality of optical subassemblies with the control board 21. Here, the optical receiver module 23B is composed of one optical subassembly, and the flexible printed circuit 22B is composed of one flexible printed circuit 103B.

Figure 3A:
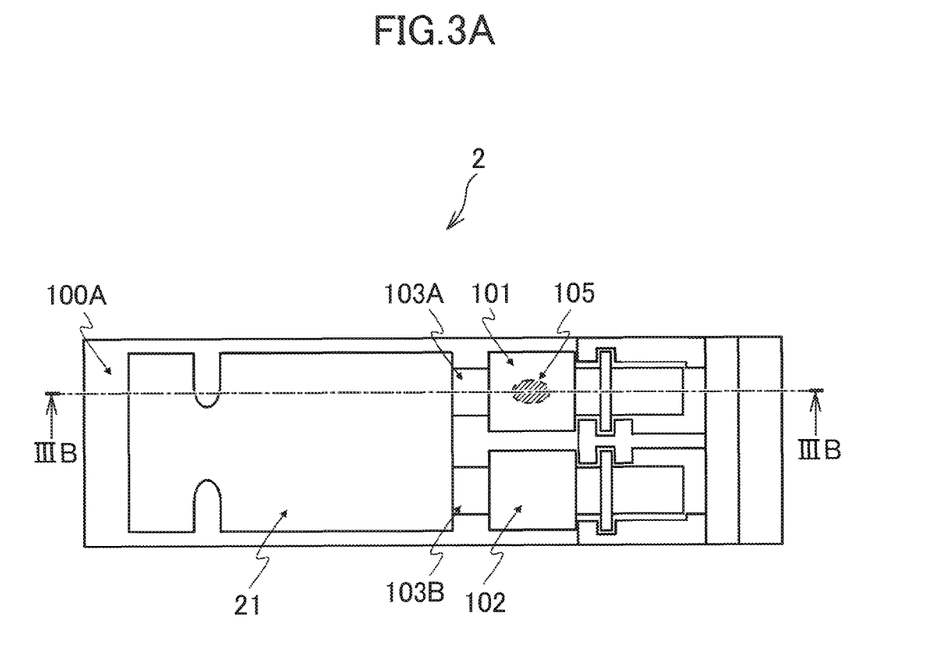
FIG. 3A is a bottom plan view of the optical module according to the embodiment of the present invention.
Figure 3B:
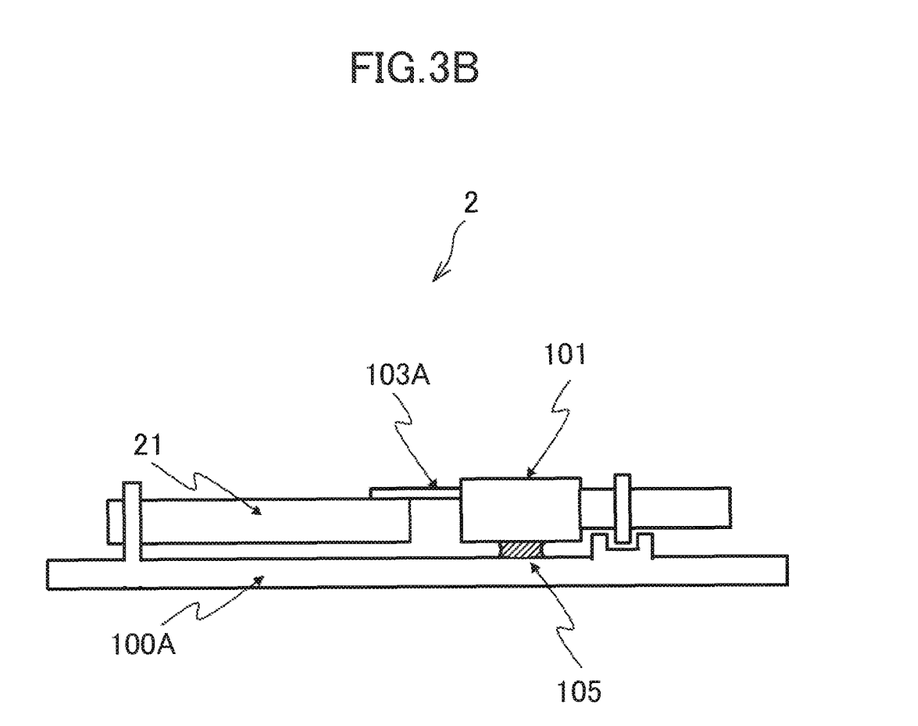
FIG. 3B is a cross-sectional view of the optical module according to the embodiment of the present invention.
Figure 3C:
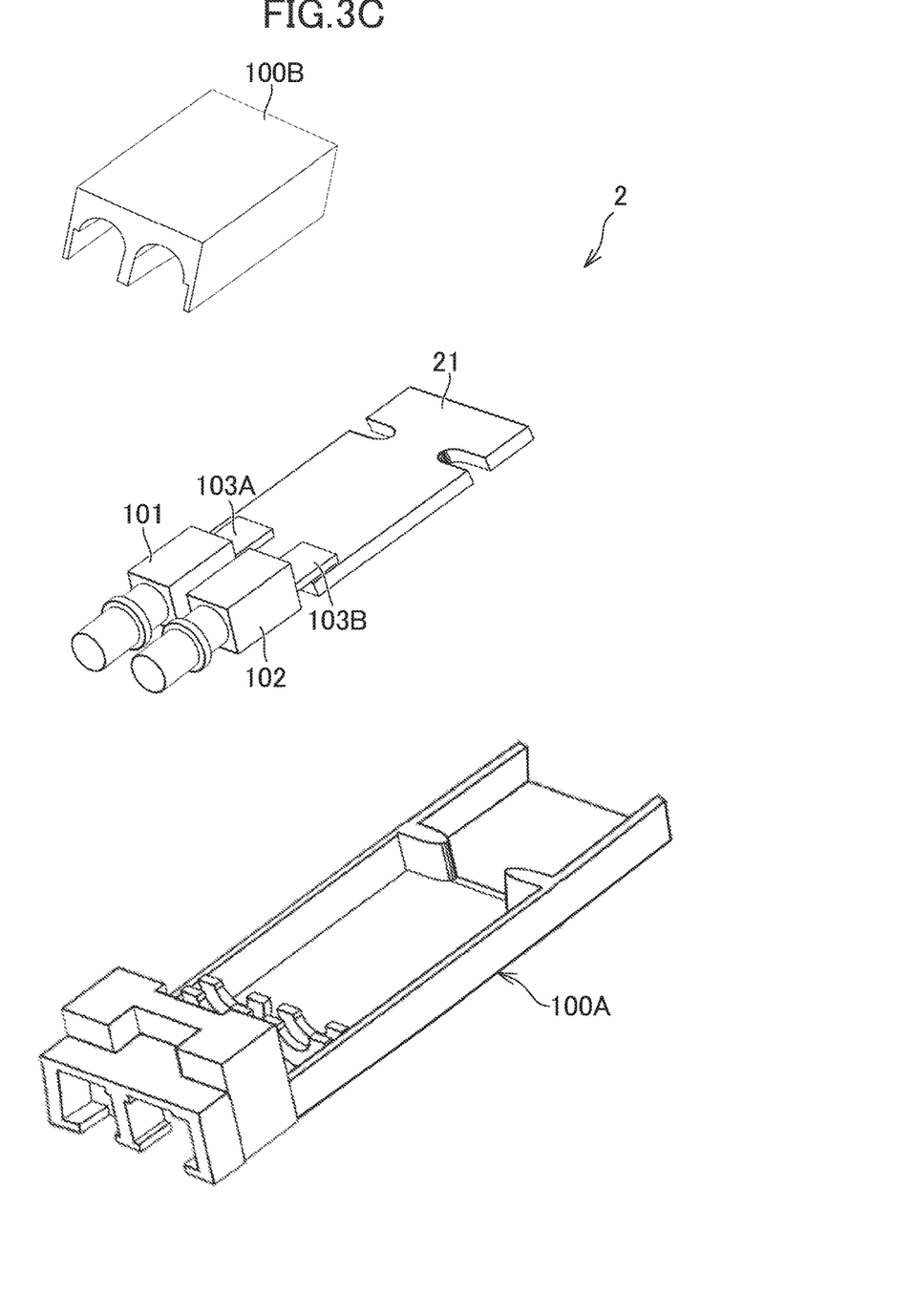
FIG. 3C is an exploded perspective view of the optical module according to the embodiment of the present invention.

FIG. 3A is a plan view of the optical module 2 according to this embodiment. FIG. 3B is a cross-sectional view of the optical module 2 according to this embodiment, illustrating a cross-section along cut line IIIB-IIIB illustrated in FIG. 3A. FIG. 3C is an exploded perspective view of the optical module 2 according to this embodiment. The optical module 2 illustrated in FIGS. 3A, 3B, and 3C is inverted from its driven state for facilitating understanding of the structure. As illustrated in FIG. 3C, the module case 100 includes a top case 100A, a fixing member 100B, and a bottom case (not illustrated). The top case 100A and the bottom case form a box-like case form. The optical subassemblies (the TOSA 101 and the ROSA 102) are disposed on the inside bottom face of the top case 100A with the bottom portions of the optical subassemblies facing the inside bottom face of the top case 100A. In FIG. 3A, an illustration of the bottom portion of the top case 100A is omitted for understanding the structure of the optical module 2. Similarly in FIG. 3B, an illustration of the fixing member 100B is omitted.

The optical module 2 is a pluggable module as described above. One end of the control board 21 is a card edge portion, and the control board 21 is used by being inserted into or removed from the optical transmission equipment 1. When the optical module 2 is inserted into or removed from the optical transmission equipment 1, a stress in the vertical direction (horizontal direction in FIGS. 3A and 3B) is applied to the control board 21. For reducing the application of such a stress also to the optical subassemblies, the optical subassemblies (the TOSA 101 and the ROSA 102) are not firmly fixed but fixed with some allowance. Moreover, the optical module 2 is inserted into or removed from the optical transmission equipment 1 in a state of being connected with the external optical fibers 3A and 3B. Especially when the optical module 2 is detached from the optical transmission equipment 1, a tensile force acts between the optical subassembly and the control board 21, which may cause disconnection at a connection place between the optical subassembly and the control board 21. For suppressing the occurrence of disconnection, the flexible printed circuits 103A and 103B are respectively connected between the optical subassemblies (the TOSA 101 and the ROSA 102) and the control board 21.

The optical subassemblies (the TOSA 101 and the ROSA 102) are not fixed in a close contact manner to the module case 100 (the top case 100A) so as to be slightly movable. A very small gap is intentionally secured between the optical subassemblies and the module case 100 (the top case 100A) to provide allowance. However, when such a very small gap is present, heat dissipation characteristics of the optical subassemblies deteriorate, which makes it difficult to secure a desired heat dissipation amount. For securing a heat dissipation property, as illustrated in FIGS. 3A and 3B, the optical module 2 according to this embodiment further includes a heat dissipation grease 105 disposed between the bottom portion of the TOSA 101 and the bottom portion of the module case 100 (the top case 100A). The heat dissipation grease 105 is disposed only at a portion of the bottom portion of the TOSA 101. That is, the bottom portion of the TOSA 101 serves as a heat dissipation face.

With reference to FIG. 3C, a method of fixing main components of the optical module 2 to the module case 100 will be described. The control board 21 includes notch portions respectively at sides on both sides of the board. The top case 100A includes two projecting portions corresponding to the two notch portions included in the control board 21. When the control board 21 is placed on the top case 100A, the two projecting portions respectively fit into the two notch portions. Moreover, the top case 100A has a shape that corresponds to the depressions and projections of the tips (receptacle terminals 209 to be described later) of the TOSA 101 and the ROSA 102. The TOSA 101 and the ROSA 102 are placed on the top case 100A, and the fixing member 100B fits into the top case 100A from the upper side, so that the TOSA 101 and the ROSA 102 are fixed. With this fixation, the TOSA 101 and the ROSA 102 are fixed to such an extent that the TOSA 101 and the ROSA 102 are not firmly in close contact with the bottom portion of the top case 100A. Therefore, with the top case 100A and the fixing member 100B, the very small gap is present between the optical subassemblies and the bottom portion (the bottom portion of the top case 100A) of the module case 100 as described above.

A main feature of the optical module 2 according to this embodiment lies in that the heat dissipation grease 105 is disposed only at a portion of the bottom portion of the TOSA 101. With such a feature, a heat dissipation amount is secured while the release of the heated generated in the TOSA 101 to the module case 100 is reduced. As a result, the power consumption of the optical module 2 is reduced on the low temperature side of the ambient temperature range in which the optical module is operated. Moreover, the rise in power consumption on the high temperature side of the ambient temperature range is also suppressed due to the secured heat dissipation amount. As a result, a difference in the power consumption of the optical module 2 between the high temperature side and the low temperature side can be reduced, and thus the power consumption of the optical module 2 in the ambient temperature range can be reduced. The heat dissipation grease 105 according to this embodiment is a silicone grease, or an oil compound obtained by adding an additive to a silicone grease.

In general, silicone is used for a heat dissipation grease. Therefore, the heat dissipation grease can be used in a wide ambient temperature range, and is used for the purpose of heat conduction, electrical insulation, or sealing mainly at a static place. For example, the heat dissipation grease is used between a CPU and a heat sink. The CPU and the heat sink are fixed together in a close contact manner. Accordingly, when the CPU and the heat sink are once fixed together with the heat dissipation grease applied therebetween, the heat sink does not shift with respect to the CPU. Therefore, it is unnecessary to consider a change in the shape (wetted area) of the heat dissipation grease.

The heat dissipation grease 105 according to this embodiment is disposed between the bottom portion of the TOSA 101 and the bottom portion of the module case 100 (the top case 100A). The heat dissipation grease 105 is applied to a proper region (area) of the bottom portion of the TOSA 101, and the TOSA 101 is mounted on the module case 100. A dispenser is used to apply the heat dissipation grease 105 to the bottom portion of the TOSA 101. The heat dissipation grease 105 can be applied to a desired region by adjusting the discharging time and pressure of the dispenser. The power consumption of the optical module 2 in the ambient temperature range can be reduced by adjusting the amount of the heat dissipation grease 105 (the total amount, coated area, etc. of the heat dissipation grease 105) applied to the bottom portion of the TOSA 101 in consideration of both the high temperature side and the low temperature side in the ambient temperature range. When considering only the high temperature side of the ambient temperature range, it is sufficient to study only further enhancement of a heat dissipation property, and thus the heat dissipation grease 105 is applied to the entire surface of the bottom portion of the TOSA 101. In the present invention, however, the heat dissipation grease 105 is disposed only at a portion of the bottom portion of the TOSA 101.

The optical module 2 is manufactured, and the optical module 2 is operated. In later use, it is desirable that the heat dissipation grease 105 has viscosity to such an extent that the form of the heat dissipation grease 105 is kept.

The bottom portion of the TOSA 101 is not fixed in a close contact manner to the bottom portion of the top case 100A. When the viscosity of the heat dissipation grease 105 is low, a region where the heat dissipation grease 105 is applied spreads, which is not desirable in terms of controlling a heat dissipation amount. The TOSA 101 is fixed through the fitting of the top case 100A and the fixing member 100B. Therefore, the heat dissipation grease 105 according to this embodiment is not used for the purpose of fixing the bottom portion of the TOSA 101 in a close contact manner to the bottom portion of the top case 100A.

Figure 4:
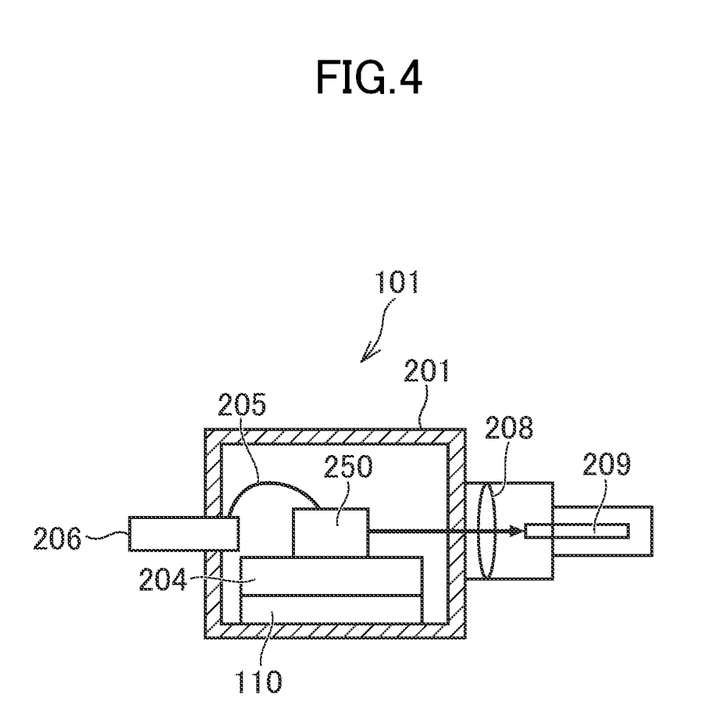
FIG. 4 is a cross-sectional view of a TOSA according to the embodiment of the present invention.

FIG. 4 is a cross-sectional view of the TOSA 101 according to this embodiment. The TOSA 101 according to this embodiment includes a package 201, a submount 204 including a bottom face and a placement face, a Peltier device 110 disposed between the bottom face of the submount 204 and the bottom face of the package 201, and a semiconductor laser device 250 (optical semiconductor device) mounted on the placement face of the submount 204. The TOSA 101 includes one or a plurality of semiconductor laser devices. In this embodiment, however, the TOSA 101 includes one semiconductor laser device 250, and the semiconductor laser device 250 is an EA-DFB laser in which an electro absorption (EA) modulator and a distributed feedback (DFB) laser are monolithically integrated on a semiconductor substrate. The Peltier device 110 is placed on the bottom portion of the TOSA 101, that is, on the inner bottom portion of the package 201. The Peltier device 110 and the package 201 are thermally connected to each other. The semiconductor laser device 250 is mounted on the Peltier device 110 through the submount 204, but is not limited to this. The semiconductor laser device 250 may be directly mounted on the Peltier device 110. In the specification, it is defined that the semiconductor laser device 250 is mounted on the Peltier device 110 when the semiconductor laser device 250 is mounted on the Peltier device 110 directly or indirectly and the semiconductor laser device 250 is in thermal contact with the Peltier device 110. The TOSA 101 further includes a plurality of (herein, two) wires 205, a feedthrough 206, a collective lens 208, and the receptacle terminal 209.

In the TOSA 101 according to this embodiment, the bottom face of the submount 204 is in physical contact with the Peltier device 110, and is thermally connected thereto. Moreover, the submount 204 and the semiconductor laser device 250 are thermally connected to each other. Therefore, the Peltier device 110 can control the temperature of the semiconductor laser device 250 through the submount 204. The submount 204 is a heat conductor, and the semiconductor laser device 250 thermally connected thereto is maintained at a temperature substantially equal to that of the submount 204 in a thermal equilibrium state. Accordingly, when the TOSA 101 is driven at a predetermined operating temperature, the Peltier device 110 controls the temperature of the submount 204 such that the submount 204 is maintained at the predetermined operating temperature (within a predetermined temperature range including the predetermined operating temperature).

The semiconductor laser device 250 is electrically connected with the feedthrough 206 through the plurality of wires 205. The semiconductor laser device 250 emits light L at a predetermined wavelength. For clarity in FIG. 4, only one wire 205 is illustrated for the plurality of wires 205. The light L output from the semiconductor laser device 250 is collected by the collective lens 208, and is incident on the receptacle terminal 209 connected with a receptor. The receptacle terminal 209 is optically connected with an external optical fiber (not illustrated), and the light output from the receptacle terminal 209 transmits through the optical fiber.

The inner structure of the package 201 of the TOSA 101 may be set into a vacuum state, or may be filled with an inert gas (e.g., a nitrogen gas, etc.), dry air, or the like. The reliability of the TOSA 101 can be increased by filling the inner structure of the package 201 with an inert gas as described above.

The heat dissipation grease 105 is applied to the bottom portion of the TOSA 101 and brought into thermal contact with the bottom portion (the top case 100A) of the module case 100, so that the heat generated in the semiconductor laser device 250 can be efficiently moved to the module case 100. In FIGS. 2, 3A, 3B, and 3C, although an IC for controlling the temperature of each of a plurality of semiconductor laser devices 250, a driver IC for a transmission signal, a driver IC for a received signal, and the like are mounted on the control board 21, the illustrations thereof are omitted for simplicity of description.

In general, an optical module conforms to standards such as 300 pin, XFP (10 Gbit Small Form Factor Pluggable), and SFP+, and the transmission rate is 10 Gbit/s in these standards. Reductions in external dimensions and lower power consumption are defined by these standards. In future standards, it is considered that operation in a wider ambient temperature range is required, and the present invention is most suitable for an optical module that is required to operate in a wide ambient temperature range. Especially, the lower limit of the ambient temperature range is desirably 0° C. or less, and further desirably −5° C. or less. In this case, it is considered that the operating temperature of the semiconductor laser device 250 is set to 40° C. or more and 60° C. or less.

Figure 5:
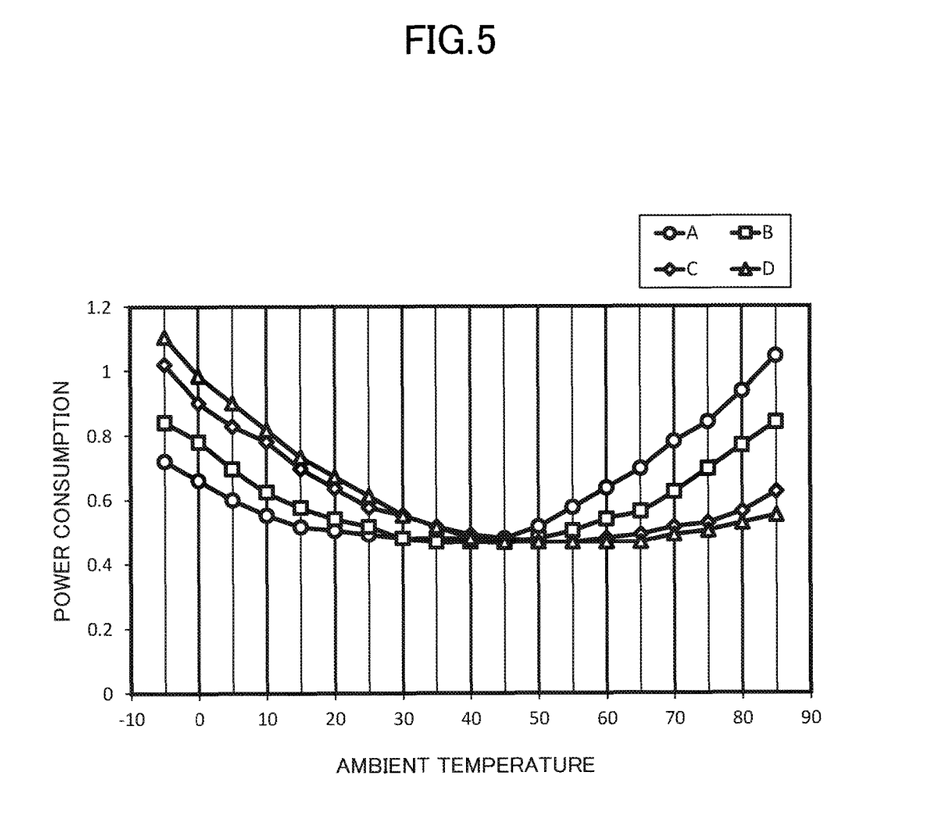
FIG. 5 is a graph illustrating the relationship between the power consumption and ambient temperature of the optical module according to the embodiment of the present invention.

FIG. 5 is a graph illustrating the relationship between the power consumption and ambient temperature of the optical module 2 according to this embodiment. FIG. 5 illustrates four kinds of coated area ratios of the heat dissipation grease. The vertical axis of the graph represents the power consumption of the optical module 2, while the horizontal axis of the graph represents the ambient temperature of the optical module 2. The power consumption shows values normalized based on a standard specification (customer specification) being set to 1. The coated area ratio is the ratio of the area of the heat dissipation grease 105 applied to the bottom face (bottom portion) of the package 201 of the TOSA 101 to the entire package 201 (coated area ratio: an area where a heat conductive member is disposed with respect to the entire bottom portion of the optical subassembly). Reference sign A represents a coated area ratio of 10%; B represents a coated area ratio of 30%; C represents a coated area ratio of 60%; and D represents a coated area ratio of 100%.

At any of the coated area ratios, the power consumption is minimum at around an ambient temperature 45° C. The operating temperature of the semiconductor laser device 250 does not necessarily coincide with this temperature, and an ambient temperature at which the power consumption is minimum may change due to various factors. As a whole, the power consumption of the optical module 2 rises for cooling the semiconductor laser device 250 with a rise in ambient temperature. However, a heat dissipation amount from the semiconductor laser device 250 rises as the coated area ratio increases, and the rise in power consumption is suppressed. Moreover, the power consumption of the optical module 2 rises as the ambient temperature drops. However, the heat dissipation amount from the semiconductor laser device 250 is reduced as the coated area ratio decreases, and the rise in power consumption is suppressed.

Figure 6:
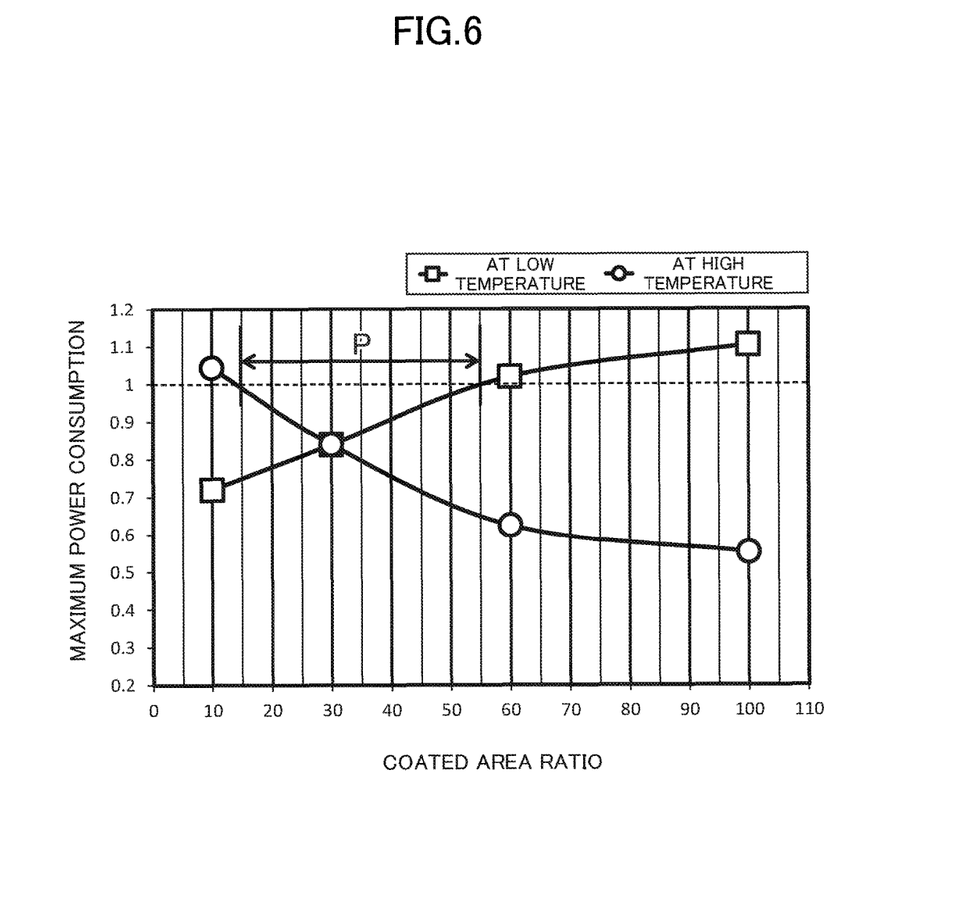
FIG. 6 is a graph illustrating the relationship between the maximum power consumption of the optical module according to the embodiment of the present invention and the coated area ratio of a heat dissipation grease.

FIG. 6 is a graph illustrating the relationship between the maximum power consumption of the optical module 2 according to this embodiment and the coated area ratio of the heat dissipation grease 105. The vertical axis of the graph represents the maximum power consumption of the optical module 2 at each of a high temperature and a low temperature, while the horizontal axis of the graph represents the coated area ratio of the heat dissipation grease 105. Here, the term "high temperature" means any temperature from the temperature at which the power consumption is minimum, illustrated in FIG. 5, to the upper limit side of the ambient temperature, while the term "low temperature" means any temperature from the temperature at which the power consumption is minimum to the lower limit side of the ambient temperature. It can be seen from FIG. 5 that the power consumption reaches the maximum power consumption at the maximum temperatures of each of a high temperature and a low temperature in the ambient temperature range, that is, at 85° C. and −5° C.

Here, the vertical axis represents numerical values normalized based on a power consumption specification being set to 1, and the maximum power consumption of the optical module 2 is required to be 1 or less in the ambient temperature range. Reference sign A does not satisfy the requirement at a high temperature, and thus is not suitable. Similarly, C and D do not satisfy the requirement at a low temperature, and thus are not suitable. A desirable coated area ratio lies in a region illustrated as a region P in FIG. 6. In such a region, a power consumption of 1 is satisfied at both the upper limit (at a high temperature) and the lower limit (at a low temperature) of the ambient temperature range. Accordingly, the coated area ratio is desirably 15% or more and 55% or less. Further, when considering a power consumption measurement margin and the like, the power consumption is preferably 0.9 or less, and the coated area ratio is further desirably 25% or more and 40% or less.

Conventionally, attention has been paid to reducing the power consumption of the optical module 2 on the high temperature side of an ambient temperature range (e.g., 0° C. or more and 70° C. or less). In that viewpoint, a structure to further release the heat generated in the semiconductor laser device 250 is desirable, and herein, it is considered that D is a desirable structure with a larger coated area ratio. However, also on the low temperature side of the ambient temperature range at which the semiconductor laser device 250 is to be heated, the power consumption necessary for heating is increased due to heat dissipation from the semiconductor laser device 250.

The maximum value of power consumption of the optical module 2 in the ambient temperature range may be not only the upper limit (highest temperature) but also the lower limit (lowest temperature). Therefore, for reducing the power consumption in the (entire) ambient temperature range, it is desirable to consider not only the upper limit but also the lower limit. It is desirable that the difference between the power consumption at the upper limit and the power consumption at the lower limit is further reduced. Specifically, it is desirable that the heat dissipation grease 105 is disposed such that the power consumption (of the optical module 2) at the lower limit with respect to the power consumption (of the optical module 2) at the upper limit falls within the range of ±10%.

Figure 7:
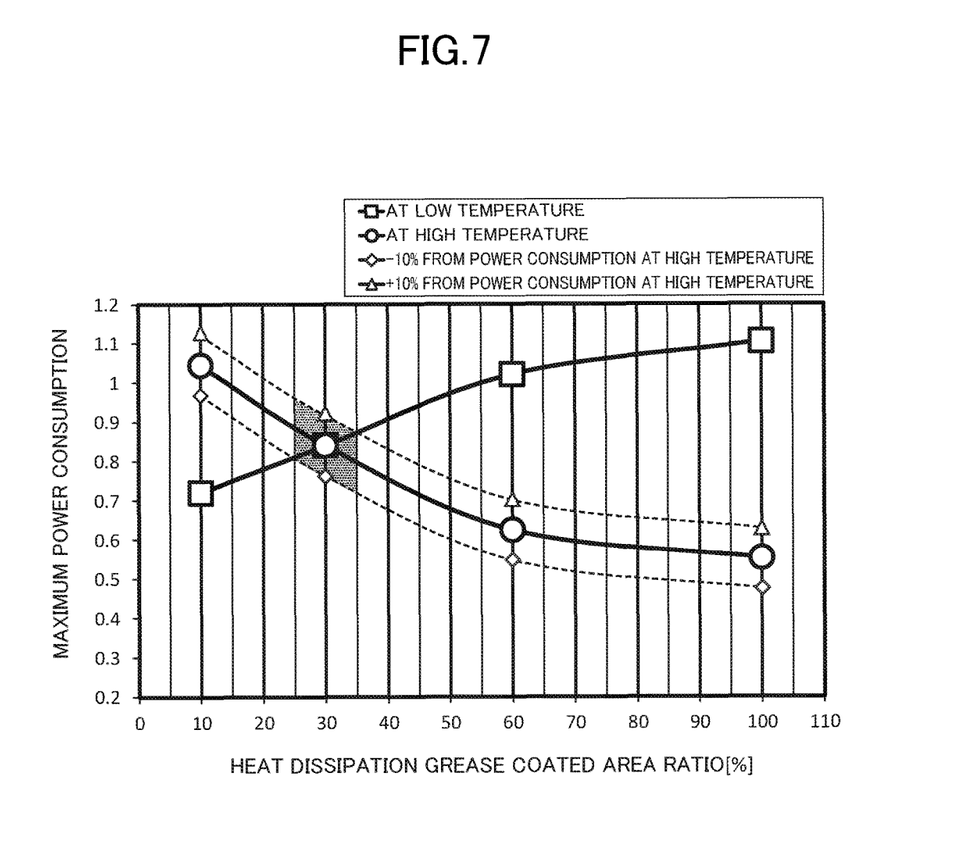
FIG. 7 is a graph illustrating the relationship between the maximum power consumption of the optical module according to the embodiment of the present invention and the coated area ratio of the heat dissipation grease.

FIG. 7 is a graph illustrating the relationship between the maximum power consumption of the optical module 2 according to this embodiment and the coated area ratio of the heat dissipation grease 105, which is obtained by adding the range of power consumption falling within ±10% of the power consumption at a high temperature (the power consumption at the highest temperature) to FIG. 6. When the heat dissipation grease is disposed such that the power consumption at a low temperature (the power consumption at the lowest temperature) falls within this range of ±10%, the power consumption of the optical module 2 can be reduced over the entire ambient temperature range. In the case of the embodiment, the coated area ratio is desirably 25% or more and 35% or less.

In the specification of power consumption, the power consumption may be required not only to be a desired value or less in the entire ambient temperature range but also to be a desired value or less at the upper limit of the ambient temperature range and be a (different) desired value or less at the lower limit. In any case, the amount of the heat dissipation grease can be determined according to the specification by examining the relationship between the coated area ratio and the maximum power consumption illustrated in FIG. 6. Moreover, the relationship illustrated in FIG. 6 may change due to factors such as the size of the optical module, the materials of the top case and the like, the optical semiconductor device to be used, and the heat conductive member to be used. However, a coated area ratio satisfying a required specification can be determined by examining as necessary a relationship similar to that of FIG. 6.

The optical module and the optical transmission equipment according to the embodiment of the present invention have been described above. Although the optical module according to this embodiment has been described as a pluggable module conforming to the SFP+ standard, the optical module is not limited to this. The present invention can be applied to a pluggable module that conforms to other standards and can operate in a wide ambient temperature range. Moreover, the optical module is not limited to a pluggable module but may be other optical modules.

Although the box type optical subassembly according to this embodiment has been described as a TOSA, the box type optical subassembly is not limited to this. The box type optical subassembly may be a ROSA or a BOSA (Bidirectional Optical Sub-Assembly) as long as the box type optical subassembly is an optical subassembly including one or a plurality of optical semiconductor devices and a temperature controller. In the box type optical subassembly, the bottom portion of a box is thermally connected with the bottom portion of a housing through a heat conductive member. When the optical subassembly is thermally connected with the housing through the heat conductive member as described above, the optical subassembly is not limited to a box type. In other words, the box type optical subassembly is not limited to a rectangular parallelepiped box shape, but includes a box shape including a bottom portion serving as a heat dissipation face.

Although the optical semiconductor device included in the optical subassembly according to this embodiment has been described as an EA-DFB laser, the optical semiconductor device may be a direct modulation type DFB laser or other semiconductor laser devices. For example, it does not matter if the optical semiconductor device is applied to a tunable laser or a semiconductor device in which a tunable laser and an external modulator such as a MZ modulator are combined together. Moreover, the optical semiconductor device is not limited to a semiconductor laser, but may be a semiconductor light-emitting element that can be used as a light source. Further, when the optical subassembly is a ROSA, the optical semiconductor device may be a semiconductor photo diode such as a Pin type diode, a PD (Photo Diode), or an APD (Avalanche Photo Diode) if the optical semiconductor device needs to be maintained at an operating temperature by a temperature controller. When the optical subassembly is a BOSA, the BOSA includes both a semiconductor light-emitting element and a semiconductor photo diode. In any case, the optical subassembly may include a plurality of optical semiconductor devices.

Although the temperature controller according to this embodiment has been described as a Peltier device, the temperature controller is not limited to this. It is sufficient that the temperature controller is a temperature controller that can perform both heating and cooling. Although the heat conductive member according to this embodiment has been described as a heat dissipation grease, the heat conductive member is not limited to this. The heat conductive member may be a gel (in the form of gel) for heat dissipation or a sheet (in the form of sheet) for heat dissipation. It is needless to say that the method of controlling the coated amount of the heat conductive member is not limited to a dispenser. Although the housing of the optical module according to this embodiment has been described as the module case 100 including the top case 100A and the fixing member 100B, the housing is not limited to this. The housing may be other cases (housings). Moreover, although, in the optical module according to this embodiment, the bottom portion of the box type optical subassembly and the bottom portion of the housing have been described as being thermally connected through the heat dissipation grease 105, the optical subassembly and the housing are not limited to this. The optical subassembly and the housing may be connected at other places such as side portions (side faces) as long as they are thermally connected to each other. The present invention can be widely applied to optical modules in which an optical subassembly including a temperature controller and one or a plurality of optical semiconductor devices is mounted.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An optical module comprising:
    a housing;
    a box type optical subassembly including a bottom portion serving as a heat dissipation face; and
    a heat conductive member disposed between the bottom portion of the optical subassembly and a bottom portion of the housing,
    wherein the optical subassembly includes
        one or a plurality of optical semiconductor devices, and
        a temperature controller on which the one or plurality of optical semiconductor devices are mounted and which is placed on an inner bottom portion of the optical subassembly, and
    the heat conductive member is disposed only at a portion of the bottom portion of the optical subassembly.

2. The optical module according to claim 1, wherein an area where the heat conductive member is disposed with respect to the entire bottom portion of the optical subassembly is 15% or more and 55% or less.

3. The optical module according to claim 1, wherein the heat conductive member is disposed such that power consumption of the optical module at a lower limit of an ambient temperature range with respect to power consumption of the optical module at an upper limit falls within a range of ±10%.

4. The optical module according to claim 1, wherein
    the heat conductive member is any one selected from the group of a heat dissipation grease, a gel for heat dissipation, and a sheet for heat dissipation.

5. An optical transmission equipment comprising the optical module according to claim 1 mounted therein.

* * * * *